United States Patent
Jeong et al.

(10) Patent No.: US 7,778,079 B2
(45) Date of Patent: Aug. 17, 2010

(54) MULTIPLE LEVEL CELL PHASE-CHANGE MEMORY DEVICES HAVING POST-PROGRAMMING OPERATION RESISTANCE DRIFT SATURATION, MEMORY SYSTEMS EMPLOYING SUCH DEVICES AND METHODS OF READING MEMORY DEVICES

(75) Inventors: Chang-Wook Jeong, Seoul (KR); Dae-Hwan Kang, Seoul (KR); Hyeong-Jun Kim, Seoul (KR); Jae-Min Shin, Suwon-si (KR); Seung-Pil Ko, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 200 days.

(21) Appl. No.: 12/079,892

(22) Filed: Mar. 28, 2008

(65) Prior Publication Data
US 2009/0016099 A1    Jan. 15, 2009

(30) Foreign Application Priority Data
Jul. 12, 2007   (KR) .................. 10-2007-0070161

(51) Int. Cl.
G11C 16/06 (2006.01)
(52) U.S. Cl. ............. 365/185.14; 365/100; 365/148; 365/230.06; 365/189.15
(58) Field of Classification Search ........... 365/185.14, 365/100, 148, 230.06, 189.15
See application file for complete search history.

(56) References Cited

U.S. PATENT DOCUMENTS 5,912,839 A  6/1999 Ovshinsky et al.
6,503,829 B2 1/2003 Kim et al.

(Continued)

FOREIGN PATENT DOCUMENTS

JP   2006-004480   1/2006

(Continued)

OTHER PUBLICATIONS

A. Pirovano, et al., "Low-Field Amorphous State Resistance and Threshold . . . ," IEEE Transactions on Electron Devices, vol. 51, No. 5., pp. 714-719, May 2004.

(Continued)

*Primary Examiner*—Thong Q Le
(74) *Attorney, Agent, or Firm*—Mills & Onello, LLP

(57) ABSTRACT

In a memory device and in a method of programming the same, a memory device comprises: a plurality of memory cells, each memory cell comprising a resistance-changeable material that has an initial resistance that is determined in response to an applied programming current in a programming operation; and a modification circuit that modifies the resistance of the memory cell following a programming operation of the memory cell to vary the resistance of the memory cell from the initial resistance to a second resistance by applying a saturation current in a saturation operation. Each memory cell is connected to a conduction line of the memory device that is used to apply the programming current to program the resistance of the corresponding memory cell in the programming operation, that is used to apply the saturation current to the corresponding memory cell in the saturation operation and that is used to apply a read current to read the resistance of the corresponding memory cell in a subsequent read operation.

26 Claims, 11 Drawing Sheets

U.S. PATENT DOCUMENTS

| | | |
|---|---|---|
| 6,625,054 B2 | 9/2003 | Lowrey et al. |
| 6,813,177 B2 | 11/2004 | Lowrey et al. |
| 6,928,022 B2 | 8/2005 | Cho et al. |
| 6,967,865 B2 | 11/2005 | Lee |
| 6,982,913 B2 | 1/2006 | Oh et al. |
| 7,012,834 B2 | 3/2006 | Cho et al. |
| 7,027,342 B2 | 4/2006 | Inoue |
| 7,085,154 B2 | 8/2006 | Cho et al. |
| 2004/0114419 A1 | 6/2004 | Lowrey et al. |
| 2004/0246804 A1 | 12/2004 | Cho et al. |
| 2004/0246808 A1 | 12/2004 | Cho et al. |
| 2005/0052904 A1 | 3/2005 | Cho et al. |
| 2005/0068804 A1 | 3/2005 | Choi et al. |
| 2005/0117388 A1 | 6/2005 | Cho et al. |
| 2005/0174841 A1 | 8/2005 | Ho |
| 2005/0276138 A1 | 12/2005 | Inoue |
| 2006/0011902 A1 | 1/2006 | Song et al. |
| 2006/0013058 A1 | 1/2006 | Kang et al. |
| 2006/0046509 A1 | 3/2006 | Gwan-Hyeob |
| 2006/0050548 A1 | 3/2006 | Oh et al. |
| 2006/0076548 A1 | 4/2006 | Park et al. |
| 2006/0092694 A1 | 5/2006 | Choi et al. |
| 2006/0118913 A1 | 6/2006 | Yi et al. |
| 2006/0120148 A1 | 6/2006 | Kim et al. |
| 2006/0138393 A1 | 6/2006 | Seo et al. |
| 2006/0152186 A1 | 7/2006 | Suh et al. |
| 2006/0180803 A1 | 8/2006 | Suh et al. |
| 2006/0180811 A1 | 8/2006 | Lee et al. |
| 2006/0181932 A1 | 8/2006 | Cho et al. |
| 2006/0186483 A1 | 8/2006 | Cho et al. |
| 2006/0192193 A1 | 8/2006 | Lee et al. |
| 2006/0226411 A1 | 10/2006 | Lee |
| 2006/0250885 A1 | 11/2006 | Cho et al. |
| 2006/0266993 A1 | 11/2006 | Suh et al. |
| 2007/0008774 A1 | 1/2007 | Khang |
| 2007/0012906 A1 | 1/2007 | Kim et al. |
| 2007/0018157 A1 | 1/2007 | Hideki |
| 2007/0020799 A1 | 1/2007 | Choi et al. |
| 2007/0029606 A1 | 2/2007 | Noh et al. |
| 2007/0030025 A1 | 2/2007 | Lim et al. |
| 2007/0051935 A1 | 3/2007 | Lee et al. |
| 2007/0054493 A1 | 3/2007 | Nam |
| 2007/0080384 A1 | 4/2007 | Noh et al. |
| 2007/0108433 A1 | 5/2007 | Lee et al. |
| 2007/0108488 A1 | 5/2007 | Suh et al. |
| 2007/0133270 A1 | 6/2007 | Jeong et al. |
| 2007/0148933 A1 | 6/2007 | Lee et al. |
| 2007/0152754 A1 | 7/2007 | Khang et al. |
| 2007/0153570 A1 | 7/2007 | Suh |
| 2007/0160760 A1 | 7/2007 | Shin et al. |
| 2007/0170881 A1 | 7/2007 | Noh et al. |
| 2007/0184613 A1 | 8/2007 | Kim et al. |
| 2007/0185712 A1 | 8/2007 | Jeong et al. |
| 2007/0189065 A1 | 8/2007 | Suh et al. |
| 2007/0194294 A1 | 8/2007 | Song et al. |
| 2007/0200108 A1 | 8/2007 | Noh et al. |
| 2008/0165570 A1* | 7/2008 | Happ et al. ............... 365/163 |

FOREIGN PATENT DOCUMENTS

| | | |
|---|---|---|
| JP | 2006-510153 | 3/2006 |
| KR | 10-2004-0075033 | 8/2004 |
| KR | 10-0642084 | 10/2006 |
| KR | 10-06474533 | 1/2007 |
| WO | WO 2004/055827 A1 | 7/2004 |

OTHER PUBLICATIONS

D. Ielmini, et al., "Recovery and Drift Dynamics of Resistance . . . ," IEEE Transactions on Electron Devices, vol. 54, No. 2, pp. 308-315, Feb. 2007.

A. Itri, et al., "Analysis of Phase-Transformation Dynamics and Estimation . . . ," 42nd Annual International Reliability Physics Symposium, pp. 209-215, Phoenix, Arizona, 2004.

R. Street, et al., "States in the Gap in Glassy Semiconductors," Physical Review Letters, vol. 35, No. 19, pp. 1293-1296, Nov. 10, 1975.

M. Kastner, et al., "Valence-Alternation Model for Localized Gap States in . . . ," Physical Review Letters, vol. 37, No. 22, pp. 1504-1507, Nov. 29, 1976.

\* cited by examiner

MULTIPLE LEVEL CELL PHASE-CHANGE MEMORY DEVICES HAVING POST-PROGRAMMING OPERATION RESISTANCE DRIFT SATURATION, MEMORY SYSTEMS EMPLOYING SUCH DEVICES AND METHODS OF READING MEMORY DEVICES

RELATED APPLICATIONS

This application claims priority under 35 U.S.C. 119 to Korean Patent Application No. 10-2007-0070161 filed on Jul. 12, 2007, the content of which is incorporated herein by reference in its entirety.

This application is related to U.S. Ser. No. 12/079,869, filed of even date herewith, entitled "Multiple-Level Cell Phase-Change Memory Devices Having Pre-Reading Operation Resistance Drift Recovery, Memory Systems Employing Such Devices, and Methods of Reading Memory Devices," by Chang-Wook Jeong, et al., and commonly owned with the present application, the content of which is incorporated herein by reference.

This application is related to U.S. Ser. No. 12/079,886, filed of even date herewith, entitled "Multiple-Level Cell Phase-Change Memory Devices Having Controlled Resistance Drift Parameter, Memory Systems Employing Such Devices, and Methods of Reading Memory Devices," by Chang-Wook Jeong, et al., and commonly owned with the present application, the content of which is incorporated herein by reference.

BACKGROUND OF THE INVENTION

A phase-change memory or phase-change random access memory (PRAM) as referred to herein is also referred to as an ovonic unified memory (OUM) in the art. The OUM cell is based on a volume of chalcogenide alloy, which, after being heated and cooled, adopts one of two stable, but programmable, phases: crystalline or amorphous. The resistance of the first phase, i.e., the crystalline phase, is relatively low, and the resistance of the second phase, i.e., the amorphous phase, is relatively high. A programming of the state of the cell to a logical one (1) or zero (0) depends on the phase of the programmable volume, and is determined by measuring its resistance. The crystalline, or conductive, state is commonly referred to as the "set", or "0", state; and the amorphous or resistive non-conductive state is commonly referred to as the "reset", or "1", state.

To make the programmable volume amorphous, it is heated above its melting point by a resistive heater. To make the programmable volume crystalline, it is heated to just below its melting point for a short period of time, e.g., 50 ns, so that the atoms line up in their crystalline locations. The volume cools rapidly into the stable amorphous or stable crystalline states when the heater is turned off. In this manner, data is written to the cell by programming the cell to either the crystalline or amorphous states. Reading of the programmed cell is performed by a sense amplifier measuring the resistance of the programmed cell.

The key to the phase-change memory is the chalcogenide material. The device historically includes an alloy of germanium (Ge), antimony (Sb) and tellurium (Te), which is referred to commonly as a GST alloy. The material is particularly useful for incorporation in a memory device because of its ability to switch rapidly, when heated and cooled, between the stable amorphous and crystalline phases.

A memory cell that incorporates a chalcogenide material typically includes a top electrode, a patterned layer, or volume, of the chalcogenide material, and a lower electrode that serves as a resistive heating element. FIG. 1 is a schematic diagram illustrating a memory cell 10 which uses the programmable chalcogenide material. The cell 10 includes a conductive top electrode 12 formed over the programmable phase change chalcogenide material 14. A conductive bottom electrode contact (BEC) 16 is formed under the programmable material 14. The bottom electrode contact (BEC) is formed of a higher resistivity material such as TiAlN, TiN, and the like, so that it operates as a resistive heater by generating heat when current flows through the BEC. An access transistor 20 (see FIGS. 2A and 2B) is connected to the bottom electrode contact 16 for controlling the flow of current through the cell 10. The gate of the access transistor 20 is commonly connected to a word line WL of the memory device incorporating the cell 10.

FIGS. 2A and 2B are schematic diagrams which illustrate the cell 10 in each of the two programmed states. In FIG. 2A, the cell 10 is shown in the conductive set, or "0", state. In this state, some portion of the programmable material 14 in contact with the BEC is in the crystalline state. In FIG. 2B, the cell 10 is shown in the resistive reset, or "1", state. In this state, some portion of the programmable material 14 in contact with the BEC is in the amorphous state.

FIG. 3 is a schematic diagram schematically illustrating the electrical configuration of the cell 10. A word line WL controls the flow of current through the cell 10 at the gate of access transistor 20. The resulting current flowing through the cell 10, $I_{CELL}$, and activation of the bit line BL connected to the top electrode 12 of the cell 10 serves to program the state of the cell 10 during a writing, or programming operation, and serves as a parameter for reading the state of the cell 10 during a reading, or sensing, operation.

FIG. 4 is a timing diagram illustrating programming of a memory cell that includes a volume of programmable chalcogenide material, for example of the type illustrated and described above in connection with FIGS. 1-3. The timing diagram of FIG. 4 is a graph of temperature with respect to time illustrating the programming pulses of heat used in conventional apparatus for programming the material to the set (crystalline) state and the reset (amorphous) state. The curve labeled 22 illustrates the time-temperature relationship for the reset pulse, i.e., the temperature pulse used to program the material to the reset (amorphous) state; and the curve labeled 24 illustrates the time-temperature relationship for the set pulse, i.e., the temperature pulse used to program the material to the set (crystalline) state.

Referring to the curve labeled 22 in FIG. 4, to change the programmable volume of chalcogenide material to the amorphous phase (reset state), the chalcogenide alloy is heated to a temperature above its melting point (Tm), by a resistive heater. The heating pulse is applied for a relatively short period of time, e.g., a few nanoseconds. The alloy cools rapidly when the heater is turned off over a time period T1, referred to as a quenching period, to a temperature that is below the crystallization temperature Tc of the volume. Following the quenching period, the volume of chalcogenide material is placed in a stable, amorphous state.

Referring to the curve labeled 24 in FIG. 4, to change the programmable volume to the crystalline phase (set state), the alloy is heated to a temperature below its melting point Tm, for example, to a temperate between the crystallization temperature Tc and the melting temperature Tm of the material, by the resistive heater. The temperature is maintained for a time period T2 that is relatively longer than the time period T1 to allow portions of the alloy to crystallize, that is, to allow the atoms in the material to align in their crystalline structure. The alloy cools rapidly when the heater is turned off, to a temperature that is below the crystallization temperature Tc of the volume. After the crystallization is achieved, the set heating pulse is removed, and the material cools to a stable, crystalline state.

Research has been conducted toward the fabrication of PRAM devices that have multiple programmable states. For example, while the above examples demonstrate PRAM cells having two states, namely amorphous (reset) and crystalline (set), others have experimented with PRAM cells having multiple so-called "hybrid", or "intermediate", states between the amorphous and crystalline "end" states.

In the intermediate states, the programmable volume is partially amorphous and partially crystalline, and by controlling the relative percentages of amorphous and crystalline volumes of programmable material, the resulting resistance of the cell can be controlled. In this manner, each resulting PRAM cell can be said to have multiple, programmable states, or multiple levels, each corresponding to a unique resistance value. Research in the field of multiple-level PRAMs has been conducted by Itri, et al., "Analysis of phase-transformation dynamics and estimation of amorphous-chalcogenide fraction in phase-change memories," IEEE $42^{nd}$ Annual International Reliability Physics Symposium, Phoenix, 2004, pp 209-215, the content of which is incorporated herein by reference.

Others have determined that the resistance value of a programmed chalcogenide volume can vary with time. See, for example, Pirovano, et al., "Low-Field Amorphous State Resistance and Threshold Voltage Drift in Chalcogenide Materials," IEEE Transactions on Electron Devices, Vol. 51, No. 5, May 2004, pp 714-719, the content of which is incorporated herein by reference. The resulting "resistance drift" is especially significant in the amorphous state of a two-level PRAM cell, and in the partially amorphous intermediate states and the fully amorphous state of the multiple-level PRAM cell.

In an attempt to control resistance drift, others have studied the behavior of resistance drift dynamics. See, for example, Ielmini, et al., "Recovery and Drift Dynamics of Resistance and Threshold Voltages in Phase-Change Memories," IEEE Transactions on Electron Devices, Vol. 54, No. 2, February 2007, pp 308-315, the content of which is incorporated herein by reference. However, resistance drift remains a difficult problem to address, especially in multiple-level PRAM devices.

SUMMARY OF THE INVENTION

Embodiments of the present invention are directed to multiple level cell phase-change memory devices, memory systems employing such devices and methods of reading memory devices, wherein resistance drift of a memory cell of the memory device is controlled by applying a saturation pulse of heating current to the memory cell following a writing operation of the cell. The saturation pulse operates to prevent, or greatly minimize, further resistance drift in the phase change material of the programmable volume of the memory cell over time. In one example, a saturation heating pulse is applied to the cell within a time period, for example, within less than about 1 µs of the programming pulse used to write data to the cell. Such heating of the cell following the write operation accelerates, or saturates, the resistance drift of the cell, so that little or no further resistance drift of the cell will occur.

In one aspect, a memory device comprises: a plurality of memory cells, each memory cell comprising a resistance-changeable material that has an initial resistance that is determined in response to an applied programming current in a programming operation; and a modification circuit that modifies the resistance of the memory cell following a programming operation of the memory cell to vary the resistance of the memory cell from the initial resistance to a second resistance by applying a saturation current in a saturation operation. Each memory cell is connected to a conduction line of the memory device that is used to apply the programming current to program the resistance of the corresponding memory cell in the programming operation, that is used to apply the saturation current to the corresponding memory cell in the saturation operation and that is used to apply a read current to read the resistance of the corresponding memory cell in a subsequent read operation.

In one embodiment, the resistance changeable material comprises chalcogenide-based material.

In another embodiment, the saturation operation stabilizes the second resistance of the memory cell to minimize resistance drift of the memory cell until a read operation following the programming operation is performed.

In another embodiment, each memory cell further comprises a heating element in thermal communication with the corresponding memory cell material of the memory cell, the heating element receiving the programming current to heat the corresponding memory cell so that the memory cell material has the initial resistance and receiving the saturation current to heat the corresponding memory cell so that the memory cell material has the second resistance.

In another embodiment, the heating element comprises an electrode in contact with the corresponding memory cell material, the heating element comprising a resistive material that generates heat when current flows through the heating element.

In another embodiment, each memory cell can be programmed by the programming operation to occupy one of a plurality of states, each state including a range of resistances that are independent of neighboring resistance ranges of neighboring states, wherein a memory cell occupies an initial state following the programming operation and wherein the modification circuit stabilizes the resistance of the memory cell to a resistance within a range of resistances that corresponds to a final state following modification by the modification circuit.

In another embodiment, the memory cell is programmed by the programming operation to occupy more than two states.

In another embodiment, a low state of the plurality of states corresponds to a state having a lowest range of resistances, a high state of the plurality of states corresponds to a state having a highest range of resistances, and at least one intermediate state of the plurality of states corresponds to at least one state having a range of resistances greater than the lowest range of resistances of the low state and less than the highest range of resistances of the high state.

In another embodiment, the modification circuit applies the saturation current when the memory cell is being programmed by the programming operation to the intermediate state and the modification circuit does not apply the saturation current when the memory cell is being programmed by the programming operation to the low state or the high state.

In another embodiment, the second resistance is greater than the initial resistance as a result of the saturation operation.

In another embodiment, the conduction line comprises a bit line and the modification circuit modifies the resistance of the memory cell by applying the saturation current in the form of a pulse of energy to a bit line of the memory cell during the saturation operation, following the programming operation.

In another embodiment, the pulse of energy has an amplitude that is less than the amplitude of the programming current.

In another embodiment, the pulse of energy is applied by a write driver circuit coupled to the memory cell via a bit line under control of the modification circuit.

In another embodiment, the plurality of memory cells comprises a plurality of addressable memory cells, and the device further comprises: a decoder that receives an address from an external source, and that generates a row signal and a column signal for accessing at least one of the addressable memory cells during the programming and read operations.

In another aspect, a memory system comprises: a memory controller that generates command and address signals; and a memory module comprising a plurality of memory devices, the memory module receiving the command and address signals and in response storing and retrieving data to and from at least one of the memory devices, wherein each memory device comprises: a plurality of addressable memory cells; a decoder that receives an address from an external source, and that generates a row signal and a column signal for accessing at least one of the addressable memory cells during programming and read operations; each memory cell comprising a resistance-changeable material that has an initial resistance that is determined in response to an applied programming current in a programming operation; and a modification circuit that modifies the resistance of the memory cell following a programming operation of the memory cell to vary the resistance of the memory cell from the initial resistance to a second resistance by applying a saturation current in a saturation operation, each memory cell being connected to a conduction line of the memory device that is used to apply the programming current to program the resistance of the corresponding memory cell in the programming operation, that is used to apply the saturation current to the corresponding memory cell in the saturation operation and that is used to apply a read current to read the resistance of the corresponding memory cell in a subsequent read operation.

In one embodiment, the resistance changeable material comprises chalcogenide-based material.

In another embodiment, the saturation operation stabilizes the second resistance of the memory cell to minimize resistance drift of the memory cell until a read operation following the programming operation is performed.

In another embodiment, each memory cell further comprises a heating element in thermal communication with the corresponding memory cell material of the memory cell, the heating element receiving the programming current to heat the corresponding memory cell so that the memory cell material has the initial resistance and receiving the saturation current to heat the corresponding memory cell so that the memory cell material has the second resistance.

In another embodiment, the heating element comprises an electrode in contact with the corresponding memory cell material, the heating element comprising a resistive material that generates heat when current flows through the heating element.

In another embodiment, each memory cell can be programmed by the programming operation to occupy one of a plurality of states, each state including a range of resistances that are independent of neighboring resistance ranges of neighboring states, wherein a memory cell occupies an initial state following the programming operation and wherein the modification circuit stabilizes the resistance of the memory cell to a resistance within a range of resistances that corresponds to a final state following modification by the modification circuit.

In another embodiment, the memory cell is programmed by the programming operation to occupy more than two states.

In another embodiment, a low state of the plurality of states corresponds to a state having a lowest range of resistances, a high state of the plurality of states corresponds to a state having a highest range of resistances, and at least one intermediate state of the plurality of states corresponds to at least one state having a range of resistances greater than the lowest range of resistances of the low state and less than the highest range of resistances of the high state.

In another embodiment, the modification circuit applies the saturation current when the memory cell is being programmed by the programming operation to the intermediate state and the modification circuit does not apply the saturation current when the memory cell is being programmed by the programming operation to the low state or the high state.

In another embodiment, the second resistance is greater than the initial resistance as a result of the saturation operation.

In another embodiment, the conduction line comprises a bit line and the modification circuit modifies the resistance of the memory cell by applying the saturation current in the form of a pulse of energy to a bit line of the memory cell during the saturation operation, following the programming operation.

In another embodiment, the pulse of energy has an amplitude that is less than the amplitude of the programming current.

In another embodiment, the pulse of energy is applied by a write driver circuit coupled to the memory cell via a bit line under control of the modification circuit.

In another aspect, an electronic device includes a memory system, the memory system comprising: a memory controller that is arranged to connect to a data bus at which data signals are transferred; and a memory device connected to the memory controller that stores and retrieves the data signals, the memory device comprising: a plurality of memory cells, each memory cell comprising a resistance-changeable material that has an initial resistance that is determined in response to an applied programming current in a programming operation; and a modification circuit that modifies the resistance of the memory cell following a programming operation of the memory cell to vary the resistance of the memory cell from the initial resistance to a second resistance by applying a saturation current in a saturation operation, each memory cell being connected to a conduction line of the memory device that is used to apply the programming current to program the resistance of the corresponding memory cell in the programming operation, that is used to apply the saturation current to the corresponding memory cell in the saturation operation and that is used to apply a read current to read the resistance of the corresponding memory cell in a subsequent read operation.

In another aspect, a method of programming a memory device, the memory device comprising a plurality of memory cells, each memory cell comprising a resistance changeable material that has an initial resistance that is determined in response to an applied programming current in a programming operation, comprises: performing a programming operation of the memory cell by applying a programming current to cause the memory cell to have an initial resistance; modifying the resistance of the memory cell following the programming operation to vary the resistance of the memory cell from the initial resistance to a second resistance by applying a saturation current in a saturation operation.

In one embodiment, the resistance changeable material comprises chalcogenide-based material.

In another embodiment, the saturation operation stabilizes the second resistance of the memory cell to minimize resistance drift of the memory cell until a read operation following the programming operation is performed.

In another embodiment, each memory cell further comprises a heating element in thermal communication with the corresponding memory cell material of the memory cell, wherein the programming operation is performed by applying the programming current to the heating element to heat the corresponding memory cell, and the resistance of the memory cell is modified by applying the saturation current to the heating element to heat the corresponding memory cell.

In another embodiment, each memory cell can be programmed by the programming operation to occupy one of a plurality of states, each state including a range of resistances that are independent of neighboring resistance ranges of neighboring states.

In another embodiment, the memory cell is programmed by the programming operation to occupy more than two states.

In another embodiment, a low state of the plurality of states corresponds to a state having a lowest range of resistances, a high state of the plurality of states corresponds to a state having a highest range of resistances, and at least one intermediate state of the plurality of states corresponds to at least one state having a range of resistances greater than the lowest range of resistances of the low state and less than the highest range of resistances of the high state.

In another embodiment, the saturation current is applied when the memory cell is being programmed by the programming operation to the intermediate state and the saturation current is not applied when the memory cell is being programmed by the programming operation to the low state or the high state.

In another embodiment, the second resistance is greater than the initial resistance as a result of the saturation operation.

In another embodiment, an amplitude of the saturation current is lower than that of the programming current preceding the saturation current.

BRIEF DESCRIPTION OF THE DRAWINGS

The foregoing and other objects, features and advantages of the embodiments of the invention will be apparent from the more particular description of preferred embodiments of the invention, as illustrated in the accompanying drawings in which like reference characters refer to the same parts throughout the different views. The drawings are not necessarily to scale, emphasis instead being placed upon illustrating the principles of the invention. In the drawings.

DETAILED DESCRIPTION OF EMBODIMENTS

Embodiments of the present invention will now be described more fully hereinafter with reference to the accompanying drawings, in which preferred embodiments of the invention are shown. The invention may, however, be embodied in different forms and should not be construed as limited to the embodiments set forth herein. Like numbers refer to like elements throughout the specification.

It will be understood that, although the terms first, second, etc. are used herein to describe various elements, these elements should not be limited by these terms. These terms are used to distinguish one element from another. For example, a first element could be termed a second element, and, similarly, a second element could be termed a first element, without departing from the scope of the present invention. As used herein, the term "and/or" includes any and all combinations of one or more of the associated listed items.

It will be understood that when an element is referred to as being "on" or "connected" or "coupled" to another element, it can be directly on or connected or coupled to the other element or intervening elements can be present. In contrast, when an element is referred to as being "directly on" or "directly connected" or "directly coupled" to another element, there are no intervening elements present. Other words used to describe the relationship between elements should be interpreted in a like fashion (e.g., "between" versus "directly between," "adjacent" versus "directly adjacent," etc.). When an element is referred to herein as being "over" another element, it can be over or under the other element, and either directly coupled to the other element, or intervening elements may be present, or the elements may be spaced apart by a void or gap.

The terminology used herein is for the purpose of describing particular embodiments and is not intended to be limiting of the invention. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements, and/or components, but do not preclude the presence or addition of one or more other features, integers, steps, operations, elements, components, and/or groups thereof.

Figure 1:
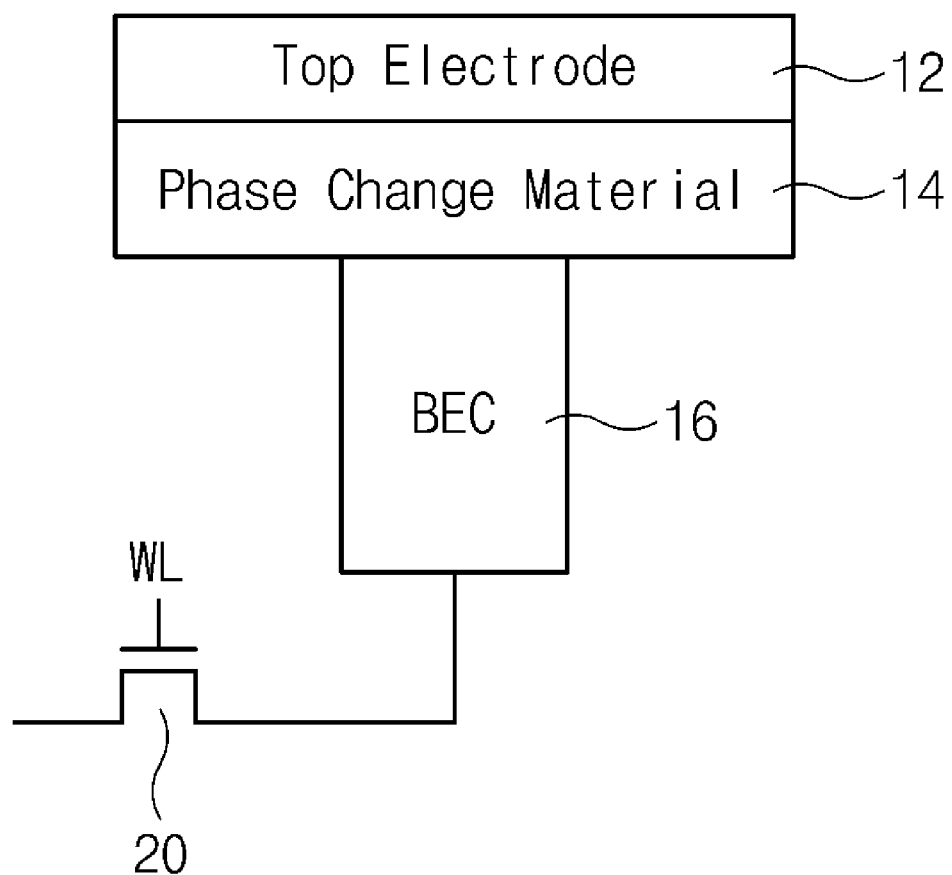
FIG. 1 is a schematic diagram that illustrates a conventional memory cell that employs a programmable chalcogenide material.
Figure 2A:
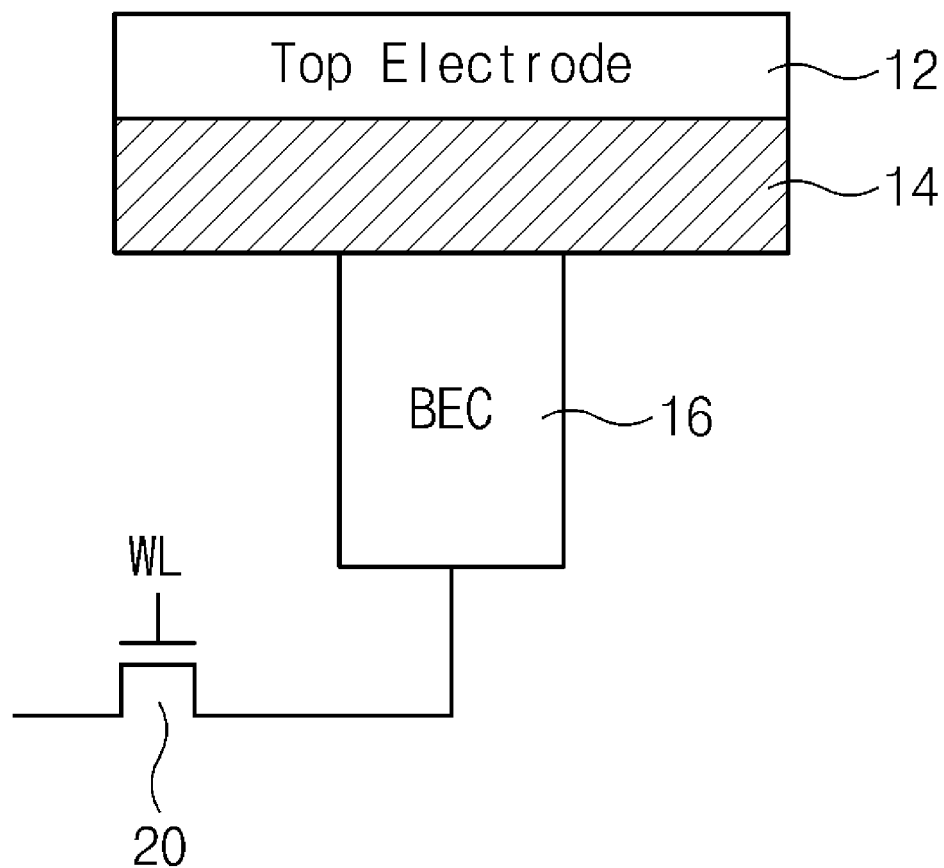
FIGS. 2A and 2B are schematic diagrams that illustrate the conventional memory cell in each of two programmed states.
Figure 2B:
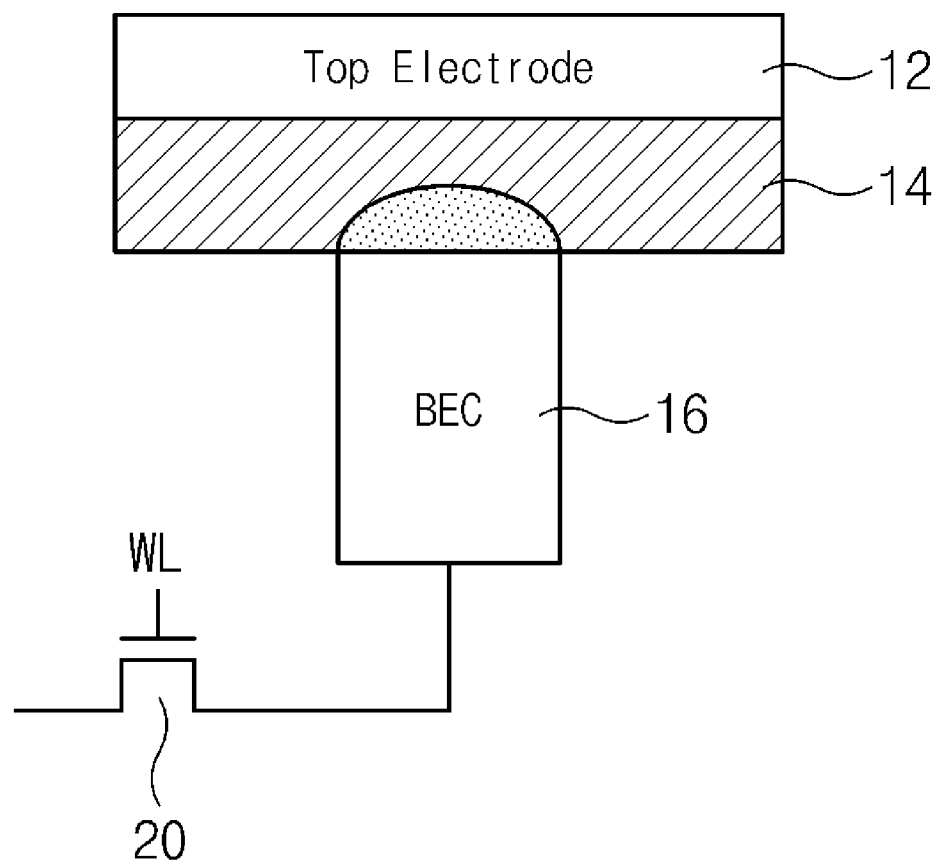
Figure 3:
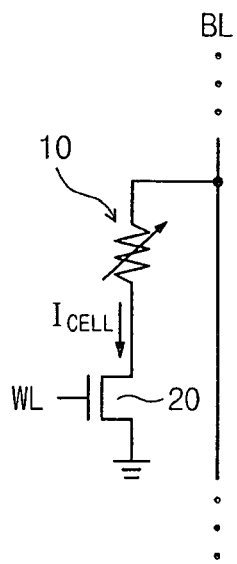
FIG. 3 is an equivalent circuit diagram of the conventional memory cell of FIGS. 1, 2A and 2B.
Figure 4:
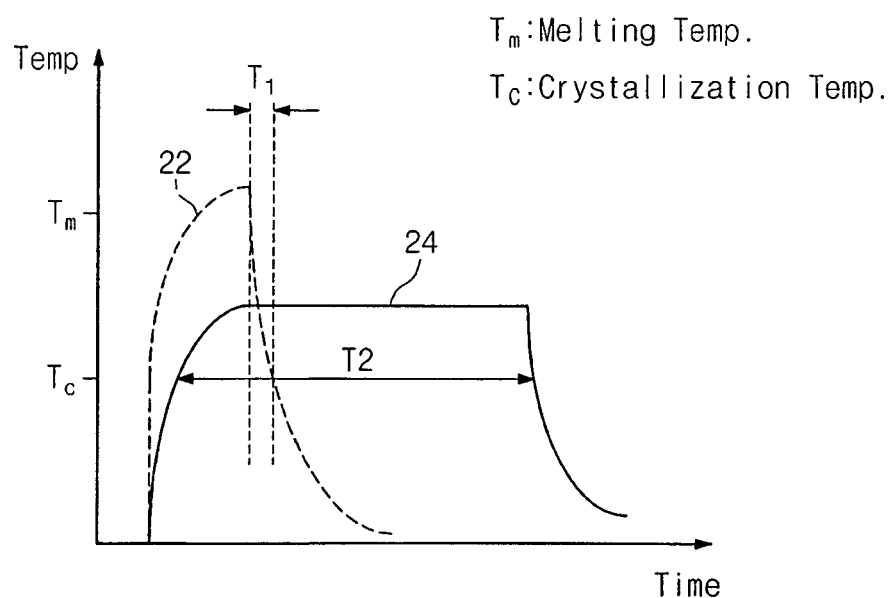
FIG. 4 is a timing diagram illustrating programming of a memory cell that includes a programmable chalcogenide material.
Figure 5A:
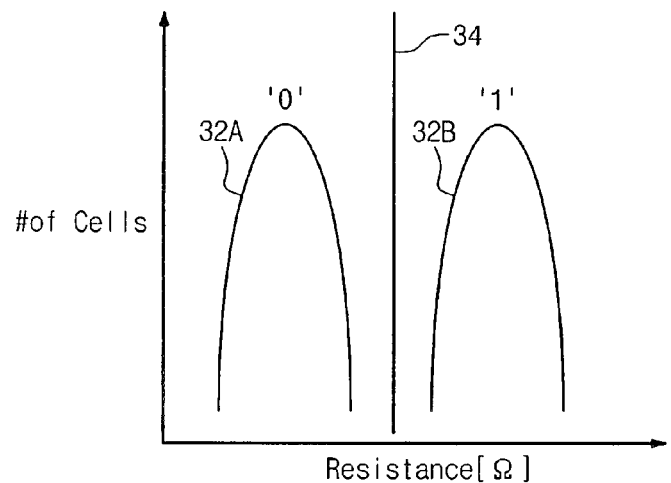
FIG. 5A is a conceptual chart of the partitioning of resistance values into two distinct states for a two-level cell.
Figure 5B:
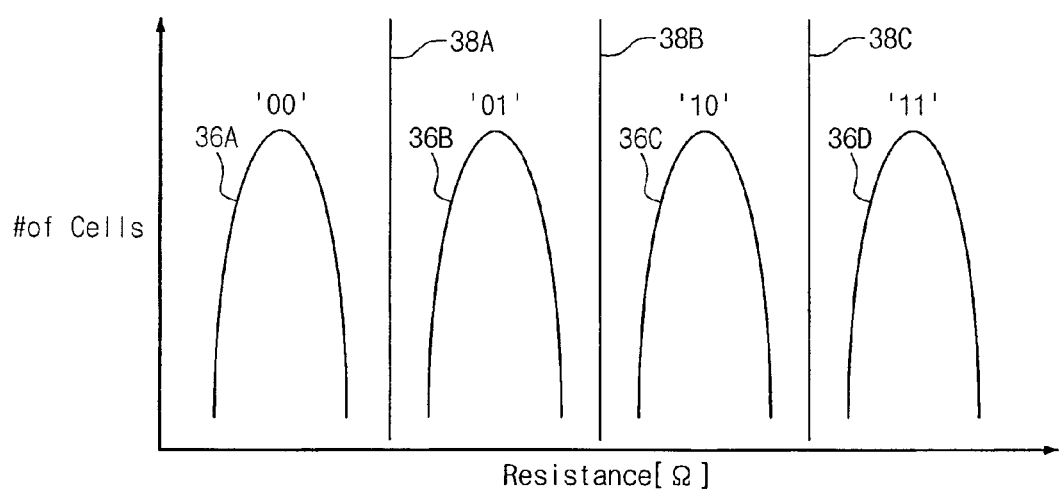
FIG. 5B is a conceptual chart of the partitioning of resistance values into multiple distinct states for a multiple-level cell, in this case, a four-level cell.
Figure 5C:
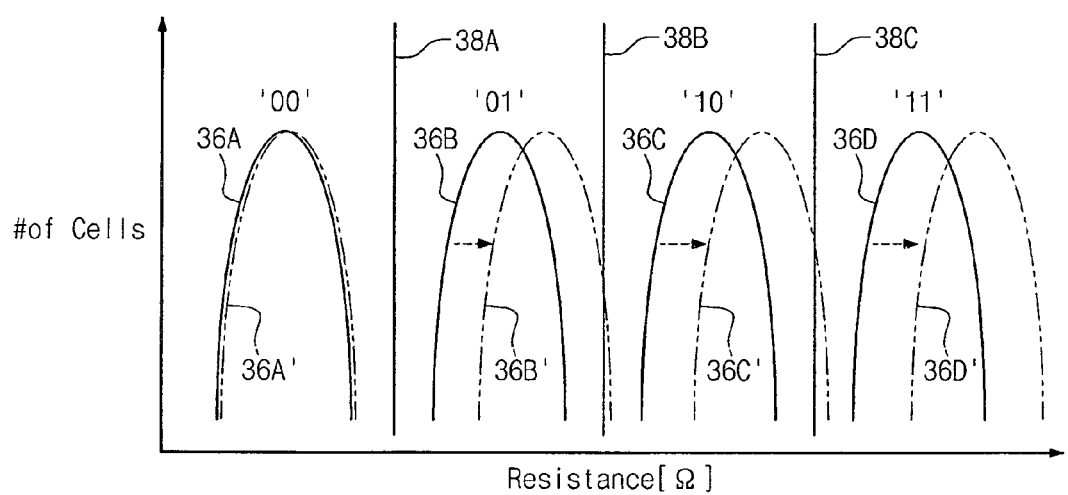
FIG. 5C is a conceptual chart of the partitioning of resistance values into multiple distinct states for the multiple level cell of FIG. 5B, illustrating the effects of resistance drift.

FIG. 5A is a conceptual chart of the partitioning of resistance values into two distinct states for a two-level phase-change memory cell; FIG. 5B is a conceptual chart of the partitioning of resistance values into multiple distinct states for a multiple-level phase-change memory cell, in this case, a four-level cell; and FIG. 5C is a conceptual chart of the partitioning of resistance values into multiple distinct states for the multiple level phase-change memory cell of FIG. 5B, illustrating the effects of resistance drift.

Referring to FIG. 5A, the states of a standard, two-level, phase-change memory cell are depicted. Such two-level cells are referred to in the art as "single-level" cells. Following programming of the cell, a distribution of resulting resistance values can fall into one of two states "0" and "1". Any resistance values of the programmed cell that fall into the range of a first distribution curve 32A are determined as a "0" state, and any resistance values of the programmed cell that fall into the range of a second distribution curve 32B are determined as a "1" state. In this case, the resistance values corresponding to the first and second distribution curves 32A, 32B are readily separable by a boundary resistance value 34; that is, if the determined resistance value is less than the boundary value 34 it is considered to correspond to the "0" state, and if the determined resistance value is greater than the boundary value 34 it is considered to correspond to the "1" state.

Referring to FIG. 5B, the states of a four-level phase-change memory cell are depicted. Following programming of the cell, resulting resistance values can fall into one of four states "00", "01", "10" and "11". The "00" and "11" states are referred to herein as "end states" since they correspond to resistance values at the lower and upper ends of the range of resistance values. The "00" end state corresponds to the crystalline state of the cell and the "11" end state corresponds to the amorphous state of the cell. The "01" and "10" states correspond to intermediate, partially-amorphous states of the cell, with the "01" state corresponding to the cell being programmed to have relatively less amorphous material and the "10" state corresponding to the cell have relatively more amorphous material. Multiple-level cells are beneficial to system integration, since more than two states can be programmed into a single cell. While the "00" and "11" states are referred to herein as corresponding to "crystalline" and "amorphous" states, respectively, such end states of the device do not necessarily correspond to "fully crystalline" and "fully amorphous" states, wherein the volume of programmable material is fully crystalline or fully amorphous. Rather, such end states can equally correspond to states that are partially crystalline and partially amorphous, as in the intermediate states, with, the "00" end state being primarily crystalline, that is containing more crystalline material than the other states, and the "11" end state being primarily amorphous, that is containing more amorphous material than the other states.

Any resistance values of the programmed cell that fall into the range of a first distribution curve 36A are determined as a "00" state, any resistance values of the programmed cell that fall into the range of a second distribution curve 36B are determined as a "01" state, any resistance values of the programmed cell that fall into the range of a third distribution curve 36C are determined as a "10" state, and any resistance values of the programmed cell that fall into the range of a fourth distribution curve 36D are determined as a "11" state. In this case, the resistance values corresponding to the first and fourth distribution curves 36A, 36D belonging to the end states "00" and "11" are readily separated from neighboring distribution curves 36B, 36C by corresponding boundary resistance values 38A, 38C. For example, if the determined resistance value is less than the boundary value 38A, it is considered to correspond to the "00" state, and if the determined resistance value is greater than the boundary value 38C it is considered to correspond to the "11" state. However, the resistance values of the second and third distribution curves 36B, 36C belonging to the intermediate states "01" and "10" are much more susceptible to the resistance drift phenomenon. This increased susceptibility is illustrated in FIG. 5C.

Referring to FIG. 5C, the effects of resistance drift on the distribution curves 36A, 36B, 36C, 36D corresponding to the four states "00", "01", "10", "11" can be seen. After a time period, the resistance values corresponding to pre-drift distribution curve 36A drift, due to the transitioning of unstable defects in the chemical lattice of the programmable volume to more stable defects, causing the curve to shift to a post-drift distribution curve 36A'. Similarly, the resistance values corresponding to pre-drift distribution curve 36B drift, causing the curve to shift to a post-drift distribution curve 36B'; the resistance values corresponding to pre-drift distribution curve 36C drift, causing the curve to shift to a post-drift distribution curve 36C'; and the resistance values corresponding to pre-drift distribution curve 36D drift, causing the curve to shift to a post-drift distribution curve 36D'.

In FIG. 5C it can be seen that post-drift distribution curve 36A' has drifted a relatively small amount, relative to its pre-drift distribution curve 36A. This is because the resistance values associated with the first distribution curve 36A are a result of the programmable volume containing relatively more, or being completely formed of, crystallized material. Since the lattice of crystallized material contains relatively fewer unstable defects than a corresponding lattice of amorphous material, the crystallized material will experience relatively less resistance drift. It can also be seen in FIG. 5C that the second, third and fourth post-drift distribution curves 36B', 36C', 36D' have drifted a relatively large amount, relative to their pre-drift distribution curves 36B, 36C, 36D. The amount of resistance drift generally increases along with increased amorphous content in the programmed volume of material.

In the case of the two-level cell (see FIG. 5A), resistance drift can be more readily managed, because the resistance values corresponding to the two states "0" and "1" can be made to be substantially separated from each other by selection of an appropriate boundary resistance value 34, so that, even after the occurrence of substantial resistance drift over long time periods, the resulting port-drift resistance value of the amorphous state "1" is still above the boundary resistance value 34, and the resulting post-drift resistance value of the crystalline state "0" is still below the boundary resistance value 34. Because only two states are needed, resistance drift is not a primary concern in the standard, two-level cell.

In the case of the multiple-level cell, having states such as those depicted in FIGS. 5B and 5C, management of resistance drift is significant. For the "00" and "11" end states, resistance drift can be readily managed by setting appropriate boundary values 38A, 38C. For example, if boundary value 38A is selected to clearly define the resistance values corresponding to the first distribution curve 36A, which is known to be less susceptible to resistance drift, then management of resistance drift for the end state "00" can be readily managed. Similarly, if boundary value 38C is selected to greatly exceed the highest of the predicted resulting post-drift resistance values corresponding to the third distribution curve 36C', then all resulting resistance values higher than this boundary value 38C can be determined to correspond to the end state "11", irrespective of the amount of resistance drift experienced by resistance values pertaining to the fourth post-drift distribution curve 36D'.

However, for the "01" and "01" intermediate states, in this example, management of the resistance drift is required. For example, resistance drift of the second pre-drift distribution curve 36B results in the second post-drift distribution curve 36B' crossing the pre-defined boundary value 38B separating the second and third, intermediate states "01" and "10". Similarly, resistance drift of the third pre-drift distribution curve 36C results in the third post-drift distribution curve 36C' crossing the pre-defined boundary value 38C separating the third state, namely intermediate states "01", and the fourth state, namely end state "11". Without proper management of the resistance drift phenomenon, it can be seen that improper state determinations can occur during a subsequent read operation of the memory cell.

The mechanism behind the resistance drift phenomenon is well-described in the Pirovano, et al. paper cited above. Resistance drift naturally occurs due to the presence of certain defect structures in the chemical lattice of the chalcogenide programmable volume upon programming. Over time, the defects, which are initially unstable (such as unstable $C_3^0$ structures, where C represents the chalcogenide atom), transition to more stable structures (such as relatively stable $C_3^+$ and $C_1^-$ structures), according to the chemical relationship:

$$2C_3^0 \rightarrow C_3^+ + C_1^- \tag{1}$$

The density of unstable defects has a direct effect on the resistance of the programmable volume; therefore, the resulting resistance of the programmable volume of material is varied. Such unstable defects are less common, i.e. they are of lower density, in the crystallized state, which is why resistance drift is less significant for a device programmed into the crystallized state than it is for a device programmed to have a percentage of amorphous material.

Embodiments of the present invention, including multiple level cell phase-change memory devices, memory systems employing such devices and methods of reading memory devices, manage resistance drift of a memory cell of the memory device by applying a saturation pulse of heating current to the memory cell following a programming, or writing, operation of the cell. The saturation pulse operates to prevent, or greatly minimize, further resistance drift in the phase change material of the programmable volume of the memory cell over time. In one example, a saturation heating pulse is applied to the cell within a time period, for example, within less than about 1 µs of the programming pulse used to write data to the cell. Such heating of the cell following the write operation accelerates the resistance drift of the cell, so that little or no further resistance drift of the cell will occur. In this manner, resistance drift of the cell occurs in a controlled, predicable, and accelerated manner; thus a reading operation of the cell can later be performed reliably, with the accelerated resistance drift of the material accounted for when conducting the reading operation. In an embodiment, delivery of the saturation pulse of heating current to the multiple-level memory cell to cause heating of the cell for acceleration of the resistance drift is performed by a write driver circuit of the device that is connected to a bit line of the memory cell.

Figure 6:
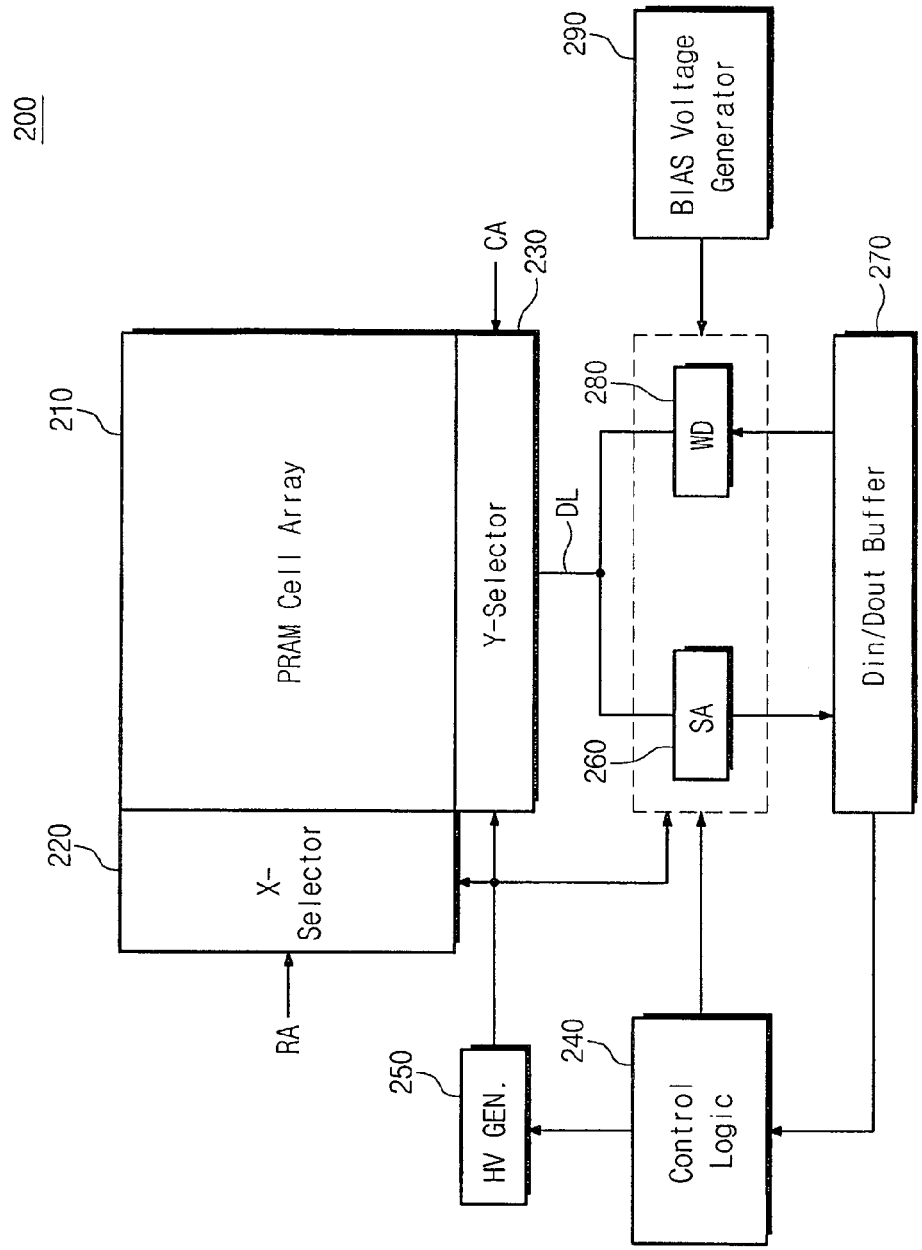
FIG. 6 is a block diagram of a memory device including a PRAM cell array, in accordance with an embodiment of the present invention.

FIG. 6 is a block diagram of a memory device 200 including a PRAM cell array 210 containing a plurality of multiple-level phase-change programmable memory cells in accordance with an embodiment of the present invention. The PRAM cell array includes an X-selector circuit 220 and Y-selector circuit 230 in accordance with standard memory device configurations. The X-selector circuit 220, also referred to as a row decoder, receives a row address RA signal, and the Y-selector circuit, also referred to as a column decoder, receives a column address CA signal.

Referring to FIG. 6, a phase change memory device 200 according to the present embodiment includes a memory cell array 210 that stores N-bit data (where N is 2 or more). A plurality of memory cells are arranged within the memory cell array 210 in rows (for example, along word lines) and columns (for example, along bit lines). Each memory cell may consist of a switching element and a resistance element. A switching element may be formed of various elements such as MOS transistors, diodes, and the like. A resistance element may be configured to include a phase-change film that includes the above-described GST material. Each memory cell may be a writable memory cell. Exemplary resistance elements are disclosed in U.S. Pat. Nos. 6,928,022, 6,967,865 and 6,982,913, the content of each being incorporated herein by reference in its entirety.

Continuing to refer to FIG. 6, a row selector circuit 220 is configured to select one of the rows (or word lines) in response to a row address RA signal, and a column selector circuit 230 is configured to select certain columns (or bit lines) in response to a column address CA signal. Control logic 240 is configured to control the overall operation of the multi-level phase change memory device 200 in response to an external read/write command. A high voltage generator circuit 250 is controlled by the control logic 240 and is configured to generate a high voltage that is used for the row and column selector circuits 220 and 230, a sense amplifier circuit 260, and a write driver circuit 280. For example, the high voltage generator circuit 250 may be implemented using a charge pump. It would be apparent to one skilled in the art that implementation of the high voltage generator circuit 250 is not limited to the embodiments described herein.

The sense amplifier circuit 260 is controlled by the control logic 240, and is configured to sense cell data via columns (or bit lines) selected by the column selector circuit 230. The sensed data SAOUT may be externally output via a data input/output buffer circuit 270. The sense amplifier circuit 260 is connected to a data bus DL, and is configured to supply sensing current I_SENSE to the data bus DL at a read operation. The write driver circuit 280 is controlled by the control logic 240, and is configured to supply write current to the data line DL according to data provided via the input/output buffer circuit 270. A bias voltage generator circuit 290 is controlled by the control logic 240, and is configured to generate bias voltages to be supplied to the sense amplifier circuit 260 and the write driver circuit 280.

In accordance with a multi-level phase change memory device, embodiments of the present invention, in particular, the control logic 240, can control the write driver circuit 280 so that a programming current as a first write current pulse, and a saturation current as a second write current pulse, are supplied sequentially at a constant time interval to respective selected bit lines, in order to minimize resistance drift in the programmable volume of the resistance-changeable material of the PRAM cell array 210. In exemplary embodiments, the saturation current is of a current level that is less than the programming current level. Under this approach, a resistance value, that is, an initial resistance value Rini, of a memory cell, can be saturated to a second, or saturated, resistance value Rsat by supplying the saturation current to the memory cell after the memory cell is programmed to one of the amorphous states. In other words, it is possible to mitigate or eliminate further resistance drift of the resistance-changeable material in a memory cell by causing the cell to undergo an increase in a resistance value just after programming, by applying the saturation current. Accordingly, when the cell is read at a later time, a predictable, saturated, resistance value for the cell will be determined for the cell, so that the state of the cell can be determined at a high degree of reliability.

Figure 7:
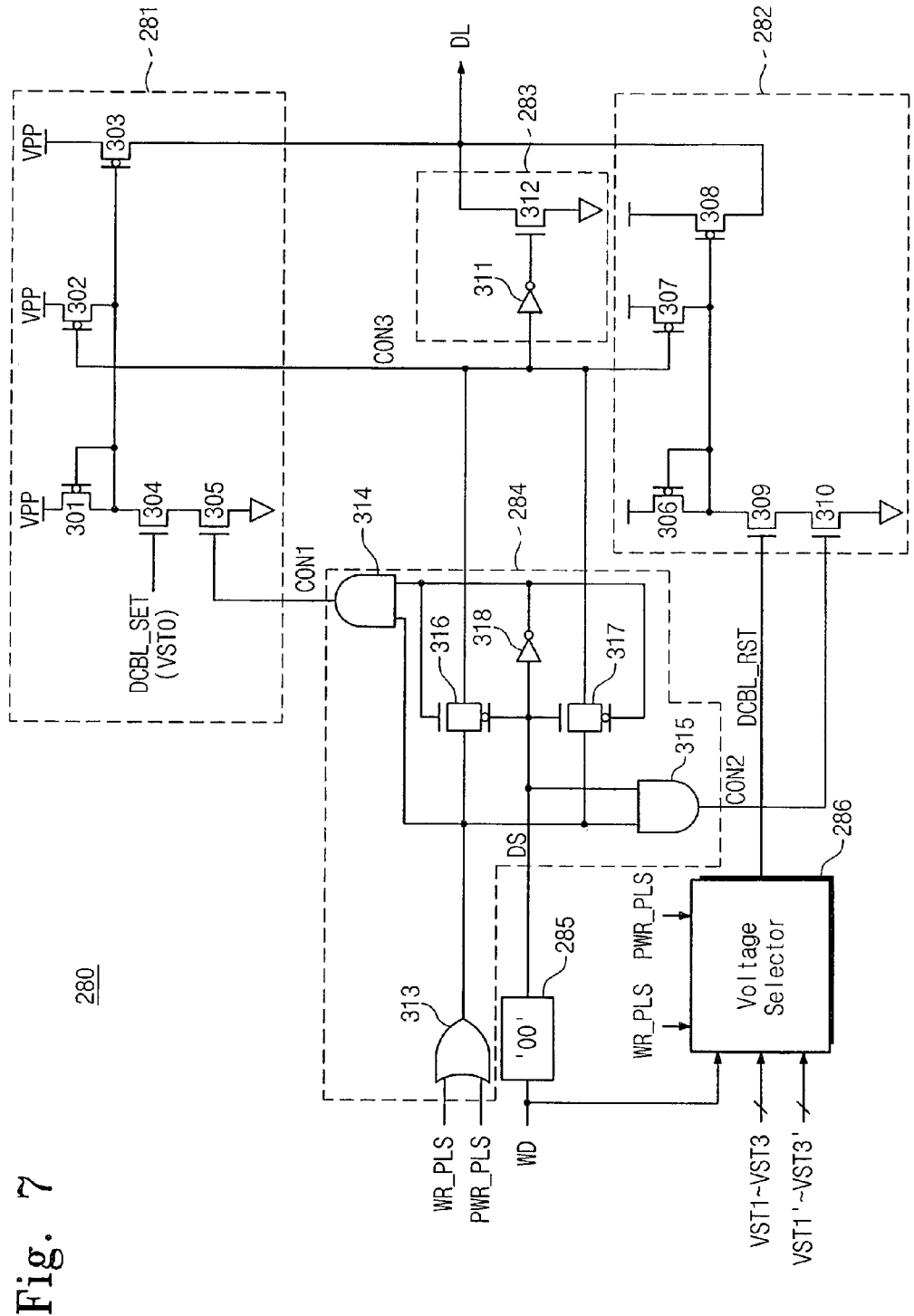
FIG. 7 is an example circuit diagram of the write driver circuit illustrated in FIG. 6, in accordance with an embodiment of the present invention.

FIG. 7 is a circuit diagram of a write driver circuit 280 illustrated in FIG. 6 in accordance with exemplary embodiments of the present invention. Referring to FIG. 7, a write driver circuit 280 according to exemplary embodiments of the present invention includes a first driver 281, a second driver 282, a discharge unit 283, a driver controller 284, a detector 285, and a reset voltage selector 286.

The first driver 281 is configured to supply a write current, for example a set current, to a data line DL in response to control signals CON1 and CON3 from the driver controller 284. The first driver 281 includes PMOS transistors 301, 302 and 303 and NMOS transistors 304 and 305, which are connected, for example, as illustrated in FIG. 7. A bias voltage DCBL_SET (or, VST0) from the high voltage generator circuit 250 (see FIG. 6) may be applied to a gate of the NMOS transistor 304 in the first driver 281. The bias voltage DCBL_SET may be set to have a constant level regardless of the data to be programmed. In other words, the amount of write current determined by the bias voltage DCBL_SET may be maintained at a constant level, irrespective of the data to be programmed.

The second driver 282 is configured to supply write current, for example a reset current to the data line DL in response to control signals CON2 and CON3 from the driver controller 284. The second driver 282 includes PMOS transistors 306, 307 and 308 and NMOS transistors 309 and 310, which are connected, for example, as illustrated in FIG. 7. A bias voltage DCBL_RST provided by the reset voltage selector 286 may be applied to a gate of the NMOS transistor 309 in the second driver 282. The bias voltage DCBL_RST may be set to vary in accordance with the data to be programmed, which will be more fully described below. The discharge unit 283 may be configured to discharge the data line DL in response to the control signal CON3 from the driver controller 284. The discharge unit 283 includes an inverter 311 and an NMOS transistor 312, which are connected, for example, as illustrated in FIG. 7.

Continuing to refer to FIG. 7, the detector 285 operates to detect whether data WD, in this case 2-bit data, to be programmed has a value '00' corresponding to the crystalline end state (see for example, crystalline end state '00' in FIG. 5B). When data WD to be programmed has a value '00' corresponding to the crystalline state, the detector 285, in this example, is configured to output a data signal DS of a low level. On the other hand, when data WD to be programmed does not have a value '00' corresponding to the crystalline end state, the detector 285, in this example, is configured to output a data signal DS at a high level.

The driver controller 284 is configured to generate the control signals CON1, CON2 and CON3 in response to the data signal DS and first and second write pulse signals WR_PLS and PWR_PLS. The driver controller 284 includes an OR gate 313, AND gates 314 and 315, transfer gates 316 and 317, and an inverter 318, which are connected, for example, as illustrated in FIG. 7. The voltage selector 286 is supplied with a plurality of write voltages VST1 to VST3 and VST1' to VST3' from a high voltage generator circuit 250, and outputs as the bias voltage DCBL_RST one of the input voltages VST1 to VST3 and VST1' to VST3' in response to data WD to be programmed and the write pulse signals WL_PLS and PWR_PLS.

During operation, it is assumed in this example, that data WD to be programmed is 2-bit data of '00' corresponding to the crystalline end state of FIG. 5C. Under this assumption, the detector 285 outputs a data signal DS at a low level. The first transfer gate 316 of the driver controller 284 is turned on by the data signal DS at a low level, while the second transfer gate 317 is turned off thereby. This enables an output of the OR gate 313 to be transferred to PMOS transistors 302 and 307 via a transfer gate 316. The data signal DS at a low level may be transferred to the AND gate 314 through inverter 318. Accordingly, the AND gate 314 can output a control signal CON1 at a high level in response to the data signal DS during a period when an output of the OR gate 313 is maintained at a high level. At this time, a control signal CON3 will have the same waveform as an output of the OR gate 313. Also, an output of the AND gate 315 will output a control signal CON2 at a low level since the data signal DS is at a low level.

Herein, the OR gate 313 is supplied with the first and second write pulse signals WR_PLS and PWR_PLS, each of which, in this example, is an active-high pulse signal. The first and second write pulse signals WR_PLS and PWR_PLS may be supplied sequentially at certain time intervals from control logic 240 (see FIG. 6) during a write operation.

An NMOS transistor 305 of the first driver 281 is turned on by the control signal CON1 at the high level, while a PMOS transistor 302 of the first driver 281 is turned off by the control signal CON3. At the same time, a bias voltage DCBL_SET is applied to the NMOS transistor 304 of the first driver 281. With this bias condition, the PMOS transistors 301 and 304 operate as a current mirror, so that write current is supplied to the data line DL via the PMOS transistor 303. In other words, when data WD to be written corresponds to the crystalline end state '00', write current, or "set current" corresponding to the bias voltage DCBL_SET is supplied to the data line DL via the first driver 281.

Since the control signal CON2 is set to a low level when data WD to be written corresponds to the '00' crystalline state, the NMOS transistor 310 of the second driver 282 will be turned off. This means that the second driver 282 does not operate, regardless of the output of the voltage selector 286, that is, the bias voltage DCBL_RST. While write current is supplied to the data line DL via the first driver 281, the NMOS transistor 312 of the discharge unit 283 is turned off by an output of the OR gate 313 transferred via the transfer gate 316.

In a case where the data WD to be programmed is 2-bit data corresponding to the intermediate states '01', '10' or the amorphous end state '11' of FIG. 5C, the detector 285 will output the data signal DS at a high level. The second transfer gate 317 of the driver controller 284 is turned on by the data signal DS being at a high level, while the first transfer gate 316 is turned off thereby. This enables an output of the OR gate 313 to be transferred to the PMOS transistors 302 and 307 via the transfer gate 317. The AND gate 315 outputs the control signal CON2 at a high level in response to the data signal DS at a high level during a period when an output of the OR gate 313 is maintained at a high level. At this time, the control signal CON3 may have the same waveform as an output of the OR gate 313. The AND gate 314 outputs the control signal CON1 at a low level based on the data signal DS being at a high level and transferred to the AND gate 314 via the inverter 318.

The NMOS transistor 310 of the second driver 282 is turned on by the control signal CON2 at a high level, while the PMOS transistor 307 of the second driver 282 is turned off by the control signal CON3. At this time, the voltage selector 286 will output as the bias voltage DCBL_RST one of the input voltages VST1 to VST3 and VST1' to VST3' in response to the data WD and the first and second write pulse signals WR_PLS and PWR_PLS. For example, while the first write pulse signal WR_PLS is maintained at a high level, the reset voltage selector 286 will output as the bias voltage DCBL_RST one of the input voltages VST1 to VST3 in accordance with the value of the data WD element to be programmed. On the other hand, while the second write pulse signal PWR_PLS is maintained at a high level, the voltage selector 286 will output as the bias voltage DCBL_RST one of the input voltages VST1' to VST3' in accordance with the value of the data WD element to be programmed. With this bias condition, the PMOS transistors 306 and 308 operate as a current mirror, so that write current, or "reset current", determined by the bias voltage DCBL_RST is supplied to the data line DL via the PMOS transistor 308. In other words, when data WD to be written has a value corresponding to one of the states '01', '10', '11' including the intermediate states and the amorphous end state '11', that is, the states other than the crystalline end state '00', write current, or reset current, corresponding to the bias voltage DCBL_RST is supplied to the data line DL via the second driver 282. Since the bias voltage DCBL_RST is varied in accordance with the data value WD to be programmed, the amount of write current, or reset current, is also varied, which will be more fully described below.

When data WD to be written is not at a value of '00' and has one of the '01', '10' or '11' values, since the control signal CON1 is set to a low level, the NMOS transistor 305 of the first driver 281 is turned off. This means that the first driver 281 does not operate regardless of the bias voltage DCBL_SET. While write current is supplied to the data line DL via the second driver 282, the NMOS transistor 312 of the discharge unit 283 is turned off by an output of the OR gate 313 transferred via the transfer gate 316.

The write driver circuit 280 in accordance with embodiments of the present invention can be thus configured to supply write current to the data line DL via the first driver 281 when data WD to be programmed has a value corresponding to crystalline end state '00' and to supply write current to the data line DL via the second driver 282 when data WD to be programmed has a value corresponding to one of remaining intermediate states '01', '10', or the amorphous end state '11'.

Figure 8:
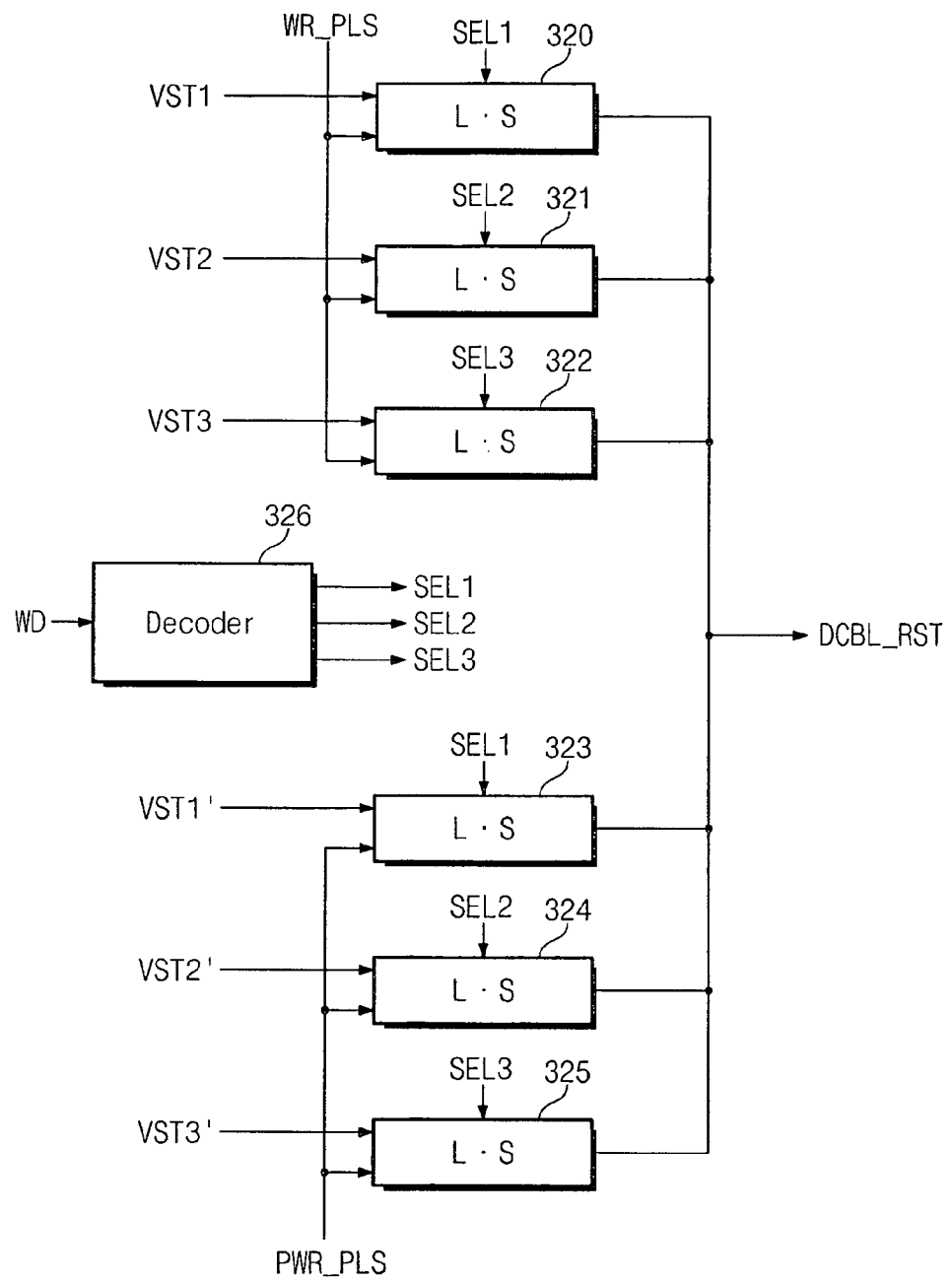
FIG. 8 is a block diagram of an example voltage selector as illustrated in FIG. 7, in accordance with an embodiment of the present invention.

FIG. 8 is a block diagram of the voltage selector illustrated in FIG. 7 in accordance with an exemplary embodiment of the present invention.

Referring to FIG. 8, the voltage selector 286 includes a plurality of level shifters 320, 321, 322, 323, 324, 325 and a decoder 326. The decoder 326 decodes data WD to be programmed and activates one of selection signals SEL1, SEL2 and SEL3. For example, when data WD to be programmed has a value of '01' corresponding to a first intermediate state, the decoder 326 activates the selection signal SEL1. When data WD to be programmed has a value of '10' corresponding to a second intermediate state, the decoder 326 activates the selection signal SEL2, and when data WD to be programmed has a value of '11' corresponding to the amorphous end state, the decoder 326 activates the selection signal SEL3.

The level shifters 320, 321, 322 are activated by the selection signals SEL1, SEL2, SEL3, respectively, and output corresponding input voltages VST1, VST2 and VST3 as the bias voltage DCBL_RST during an active period of the first write pulse signal WR_PLS. For example, the level shifter 320 outputs the input voltage VST1 as the bias voltage DCBL_RST during an active period of the first write pulse signal WR_PLS when the selection signal SEL1 is activated. The level shifter 321 outputs the input voltage VST2 as the bias voltage DCBL_RST during an active period of the first write pulse signal WR_PLS when the selection signal SEL2 is activated. The level shifter 322 outputs the input voltage VST3 as the bias voltage DCBL_RST during an active period of the first write pulse signal WR_PLS when the selection signal SEL3 is activated.

Herein, in this illustrative embodiment (see FIG. 9A), the write voltage VST1 is lower in voltage level than the write voltage VST2, and the write voltage VST2 is lower in voltage level than the write voltage VST3.

The level shifters 323, 324, 325 are activated by the selection signals SEL1, SEL2, SEL3, respectively, and output corresponding input voltages VST1', VST2' and VST3' as the bias voltage DCBL_RST during an active period of the second write pulse signal PWR_PLS. For example, the level shifter 323 outputs the input voltage VST1' as the bias voltage DCBL_RST during an active period of the second write pulse signal PWR_PLS when the selection signal SEL1 is activated. The level shifter 324 outputs the input voltage VST2' as the bias voltage DCBL_RST during an active period of the second write pulse signal PWR_PLS when the selection signal SEL2 is activated. The level shifter 325 outputs the input voltage VST3' as the bias voltage DCBL_RST during an active period of the second write pulse signal PWR_PLS when the selection signal SEL3 is activated.

Herein, in this illustrative embodiment (see FIG. 9A), the write voltage VST1 is higher in voltage level than the write voltage VST1', the write voltage VST2 is higher in voltage level than the write voltage VST2', and the write voltage VST3 is higher in voltage level than the write voltage VST3'.

Figure 9A:
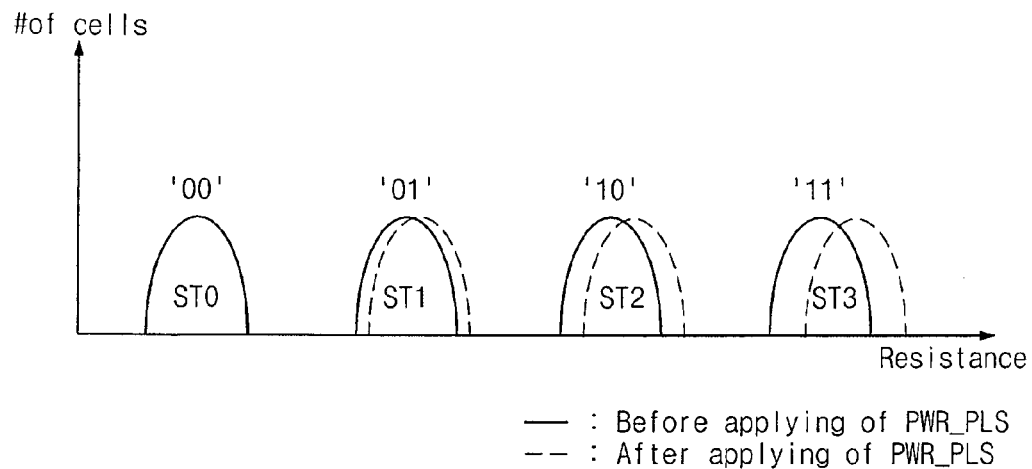
FIGS. 9A-9C are conceptual charts and timing diagrams for describing a write operation of a multiple-level phase change memory device, according to embodiments of the present invention.
Figure 9B:
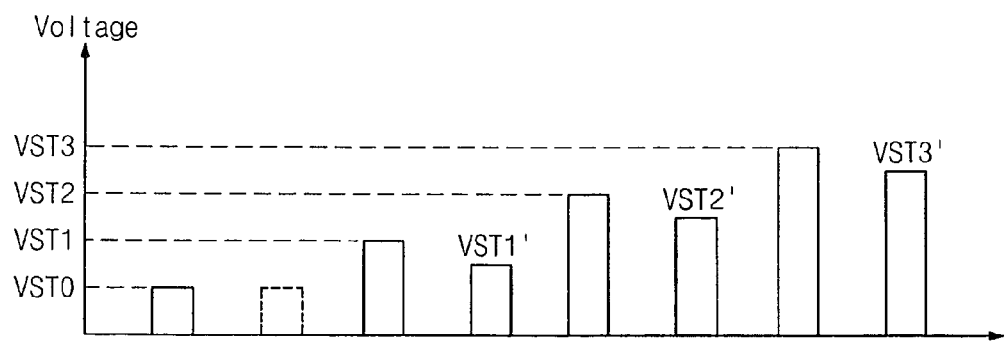
Figure 9C:
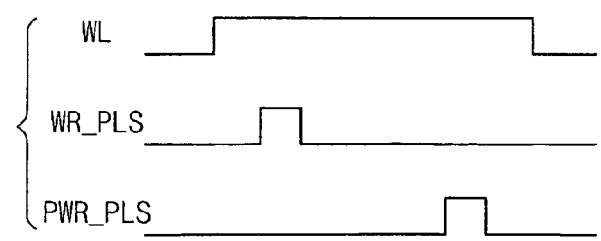

FIGS. 9A-9C are conceptual charts for describing a write operation of a multi-level phase change memory device according to embodiments of the present invention. A write operation of a multi-level phase change memory device according to an embodiment of the present invention will now be more fully described with reference to accompanying drawings.

With reference to FIG. 6, when a write operation commences, data to be programmed may be loaded onto the input/output data buffer circuit 270. The column selector circuit 230 selects bit lines corresponding to an input column address under the control of control logic 240, and a row selector circuit 220 selects a word line corresponding to an input row address under the control of control logic 240. At the same time, a high voltage generator circuit 250 operates to generate a high voltage required for a write operation in response to a control of the control logic 240. For convenience of description, a write operation will be described with respect to a single memory cell.

Assuming that data WD to be stored in a selected memory cell corresponds to the intermediate state '01' (or ST1 state), referring to FIG. 7, the detector 285 of the write driver circuit 280 outputs a data signal DS at a high level. When the data signal DS is at a high level, the first transfer gate 316 is turned off and the transfer gate 317 is turned on, and the data signal DS at a high level is applied to an input of the AND gate 314 via the inverter 318. This means that the control signal CON1 is maintained at a low level regardless of an output of an OR gate 313, as described above. Accordingly, the first driver 281 does not operate.

The control logic 240 (see FIG. 6) generates a first write pulse signal WR_PLS, which is sent to the AND gate 315 via the OR gate 313. An output of the AND gate 315, that is, the control signal CON2 is activated high during a pulse period of the first write pulse signal WR_PLS. Accordingly, the NMOS transistor 310 of the second driver 282 is turned on by the control signal CON2 at a high level. At the same time, the voltage selector 286 outputs as the bias voltage DCBL_RST one of write voltages VST1 to VST3 in response to the first write pulse signal WR_PLS and data WD to be programmed. In particular, since data WD to be programmed is '01', a decoder 326 in the voltage selector 286 activates a selection signal SEL1. As the selection signal SEL1 is activated, a level shifter 320 outputs the write voltage as the bias voltage DCBL_RST (see FIG. 8).

In the second driver 282, as the write voltage VST1 as the bias voltage DCBL_RST is applied to the NMOS transistor 309 and as the control signal CON2 at a high level is applied to the NMOS transistor 310, the PMOS transistors 306 and 308 operate as a current mirror. This means that the data line DL is supplied with write current corresponding to the bias voltage DCBL_RST, that is, the write voltage VST1. Write current supplied to the data line DL is applied to a memory cell via a bit line. As write current corresponding to write voltage VST1 is supplied to a memory cell, it is programmed to have the first intermediate state '01'. That is, 2-bit data of '01' is stored in the corresponding memory cell. At this time, a resistance element in the memory cell is set to an initial resistance value, as shown by the solid-line distribution curve of FIG. 9A, corresponding to write data '01' (the ST1 state).

Following programming of the memory cell to the initial resistance value, as illustrated in FIG. 9, the control logic 240 (see FIG. 6) next generates a second write pulse signal PWR_PLS following the first write pulse signal WR_PLS, as shown in FIG. 9C. At this time, as above described, since the data signal DS at a high level is applied to the AND gate 314 via the inverter 318, the control signal CON1 is maintained at a low level regardless of the output of the OR gate 313, and accordingly, the first driver 281 does not operate.

The second write pulse signal PWR_PLS is sent to the AND gate 315 via the OR gate 313. This means that an output of the AND gate 315, that is, the control signal CON2 is activated high during a pulse period of the second write pulse signal PWR_PLS. Accordingly, the NMOS transistor 310 of the second driver 282 is turned on by the control signal CON2 being at a high level. At the same time, the voltage selector 286 outputs as the bias voltage DCBL_RST one of the write voltages VST1' to VST3' in response to the second write pulse signal PWR_PLS and the data element WD to be programmed. In particular, in this example, since the data WD to be programmed corresponds to the intermediate state '01', the decoder 326 in the voltage selector 286 activates the selection signal SEL1. As the selection signal SEL1 is activated, the level shifter 323 outputs the write voltage VST1' as the bias voltage DCBL_RST.

In the second driver 282, as the write voltage VST1' is applied to the NMOS transistor 309 as the bias voltage DCBL_RST, and as the control signal CON2 at a high level is applied to the NMOS transistor 310, the PMOS transistors 306 and 308 operate as a current mirror. This means that post-write current, or saturation current, corresponding to the bias voltage DCBL_RST, that is, the write voltage VST1', is supplied to the data line DL. As in the first write current described above, the saturation current supplied to the data line DL is applied to the memory cell via a bit line. As the saturation current corresponding to the write voltage VST1' is supplied to the memory cell, the initial resistance value of the resistance element in the memory cell becomes saturated to a saturation resistance value Rsat as shown by the dashed-line distribution curve of FIG. 9A, corresponding to write data '01' (the ST1 state).

Methods of programming a selected memory cell with 2-bit write data of '10' or '11' values (corresponding to the ST2 or ST3 states) is substantially similar to that described above, and description thereof is thus omitted. In each case, the bias voltage DCBL_RST applied to the NMOS transistor 309 is varied. In particular, in the case of writing 2-bit data of '10' in a selected memory cell, a write voltage VST2 is selected as the bias voltage DCBL_RST when the first write pulse signal WR_PLS is activated, and a write voltage VST2' is selected as the bias voltage DCBL_RST when the second write pulse signal PWR_PLS is activated. In case of storing 2-bit data of '11' in a selected memory cell, a write voltage VST3 is selected as the bias voltage DCBL_RST when the first write pulse signal WR_PLS is activated, and a write voltage VST3' is selected as the bias voltage DCBL_RST when the second write pulse signal PWR_PLS is activated.

In the case of programming a selected memory cell with 2-bit write data of '00', no post-write saturation current pulse is supplied to the selected memory cell since, in the primarily crystalline end state of '00' (the ST0 state), little to no resistance drift is experienced by the programmable volume of the cell. Therefore, device response can be increased by not requiring application of a second, saturation, pulse current for this '00' state. Assuming that data WD to be stored in a selected memory cell corresponds to the '00' state, the detector 285 of the write driver circuit 280 will output the data signal DS at a low level. When the data signal DS is at a low level, the transfer gate 316 is turned on and the transfer gate 317 is turned off. Since the data signal DS is maintained at a low level, the control signal CON2 is maintained at a low level regardless of the output of the OR gate 313. Accordingly, the second driver 282 does not operate. In other words, although the second write pulse signal PWR_PLS may be generated by the control logic, no post-write current is supplied to the data line DL via the second driver 282. At the same time, the data signal DS at a high level is applied to the AND gate 314 via the inverter 318.

The control logic 240 generates the first write pulse signal WR_PLS, which is sent to the AND gate 314 via the OR gate 313. This means that an output of the AND gate 314, that is, the control signal CON1 is activated high during a pulse period of the first write pulse signal WR_PLS. Accordingly, the NMOS transistor 305 of the first driver 281 is turned on by the control signal CON1 being at a high level. Further, the NMOS transistor 304 of the first driver 281 is supplied with the bias voltage DCBL_SET as a write voltage VST0. In the first driver 281, as the bias voltage DCBL_SET as a write voltage VST0 is applied to the NMOS transistor 304 and as the control signal CON1 at a high level is applied to the NMOS transistor 305, the PMOS transistors 301 and 303 operate as a current mirror, so that write current is supplied to the data line DL via the PMOS transistor 303, which, in turn, is applied to a memory cell via a bit line. Accordingly, a memory cell can be programmed to have a resistance value that corresponds to the '00', or ST0, state.

Assuming the control logic 240 is configured to generate the second write pulse signal PWR_PLS following the first write pulse signal WR_PLS, each during a condition where the two-bit write data corresponds to the '00', or ST0, state, the bias voltage DCBL_SET applied to the NMOS transistor 304 of the first driver 281 at generation of the second write pulse signal PWR_PLS is identical to the bias voltage DCBL_SET applied to the NMOS transistor 304 of the first driver 281 at generation of the first write pulse signal WR_PLS. Accordingly, although write current is supplied to a memory cell based on generation of the second write pulse signal PWR_PLS, under these conditions, the initial resistance value Rini of the memory cell will not be changed.

It has been determined that application of the second write pulse PWR_PLS, or saturation current pulse, as applied by the write driver circuit 280 of FIG. 7, can be set, in one example embodiment, to have a duration of less than about 500 ns, and can occur within less than about 1 μs of completion of the application of the first write pulse WR_PLS during a programming or write operation of the cell. The amount of thermal energy that is supplied to the memory cell as a result of the saturation pulse PWR_PLS can be calculated as a function of the pulse amplitude multiplied by the pulse length. The thermal energy supplied by the saturation pulse should be sufficient to accelerate the resistance drift of the material, without causing a phase change in the material. The above-mentioned pulse-timing and pulse-duration values are only provided as example, or typical, values, and other values are equally applicable to the embodiments of the present invention.

It has been determined that the second write pulse PWR_PLS, or saturation pulse, does not need to be applied following the first write pulse WR_PLS in all states to be programmed. For example, as stated above, the end state associated with the lowest percentage of amorphization, for example, the crystallized end state, will experience little to no resistance drift over time. This end state is shown as state "00" above in connection with FIGS. 5B and 5C (or ST0 in FIG. 9A), in the four-state example. A saturation pulse is optional, and need not necessarily be applied following programming of a memory cell to this state, since little to no resistance drift will occur in the device as a result of the saturation pulse. Without the saturation pulse, the device will experience little to no resistance drift over time. Therefore, a suitable boundary value 38A can be readily predicted for this state, irrespective of the application of the saturation pulse.

In addition, for a programming operation of the cell to the end state associated with the highest percentage of amorphization, it may not be necessary to apply the saturation pulse. This end state is shown as state "11" above in connection with the example of FIGS. 5B and 5C (or ST3 in FIG. 9A). As explained above, this end state is simply defined by all resistance values having a value greater than the boundary value 38C. Since resistance drift in the cell over time only operates to raise the resistance of the programmable material, resistance drift following programming to this state is entirely tolerable, and will not affect the outcome of the subsequent reading operation. Assuming this, application of a saturation pulse following programming to this end state is optional, and not required.

With the above in mind, it can be seen that the resulting memory device can be made to be more efficient by applying the saturation pulse only when needed. In the above example, a saturation pulse is applied following programming of the cell to the intermediate states "01" and "10", and a saturation pulse is not applied following programming of the cell to the end states "00" and "11". This can lead to improved power efficiency for the device, since the heating current is applied only when needed, and can lead to improved programming speed for the programming of cells to the end states, since the additional time needed for the saturation pulse is not required.

It should be noted that although the embodiments of the present invention described above illustrate application of the saturation pulse by the write driver circuit WD, other circuits that may be capable of delivering such a saturation pulse to the memory cell may be employed. For example, in a typical phase-change memory device, both the write driver circuit WD and the sense amplifier circuit SA are connected to bit lines of the cell array via the data lines DL through the Y-selector 230, as shown in FIG. 6 above. In other configurations of the present invention, the sense amplifier circuit SA can alternatively be employed to deliver the saturation pulse to the memory cell via the Y-selector 230.

Figure 10:
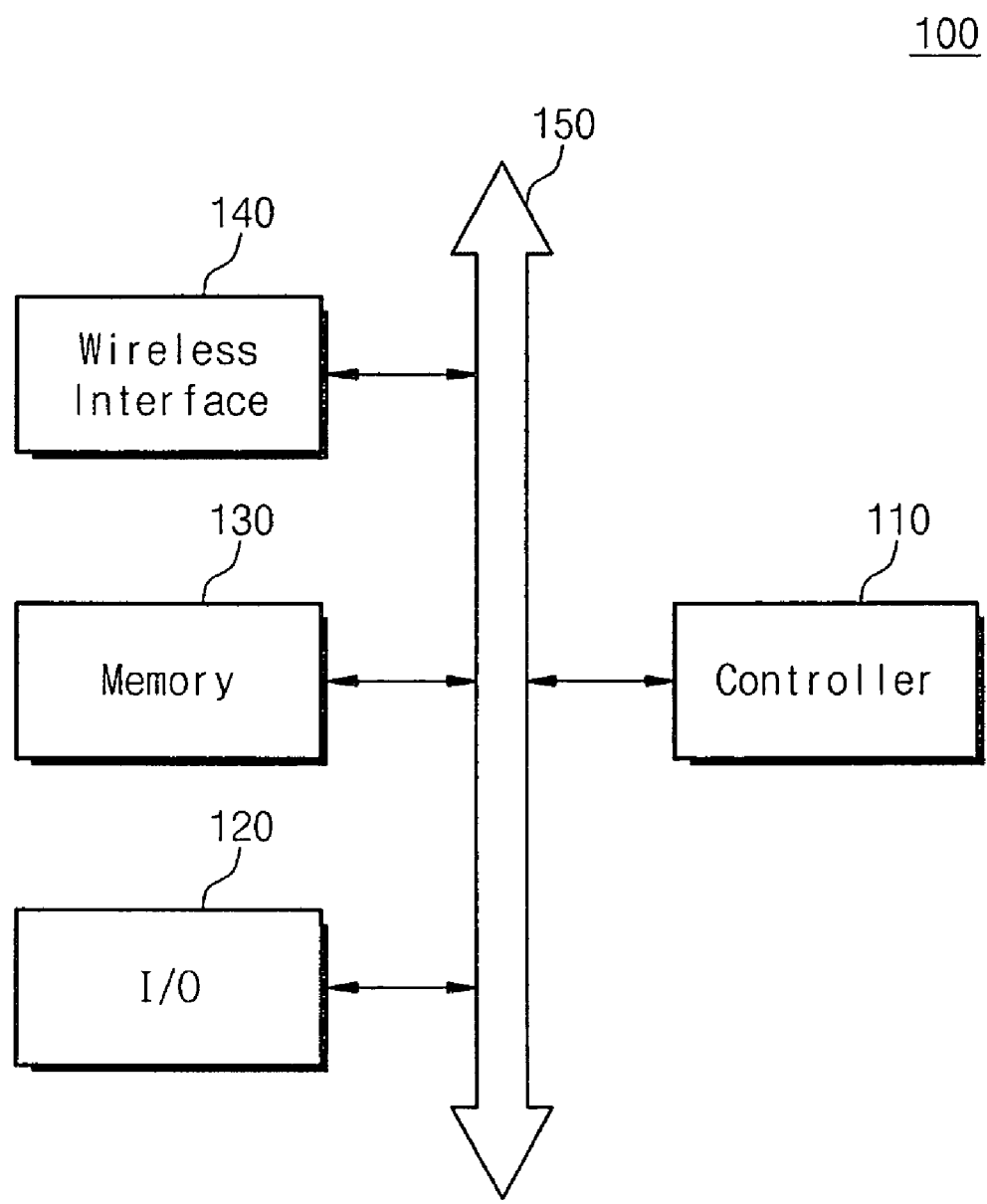
FIG. 10 is a block diagram of an electronic device including a semiconductor device PRAM cell array containing a plurality of multiple-level phase-change programmable memory cells in accordance with an embodiment of the present invention.

FIG. 10 is a block diagram of an electronic device 100 including a semiconductor device PRAM cell array containing a plurality of multiple-level phase-change programmable memory cells in accordance with an embodiment of the present invention. In various examples, the electronic device 100 can be used as a wireless communication device, i.e., PDA, laptop computer, mobile computer, web tablet, mobile phone, digital music player, or any device configured to transmit and/or receive information in a wireless environment. The electronic device 100 may include an input/output device 120, a memory 130, a wireless interface 140 and a controller 110 that communicate via a bus 150. The controller 110 comprises, for example, at least one of a microprocessor, digital signal processor, or microcontroller. The input/output device 120 may include, for example, a keypad, keyboard and display unit. The memory 130 may be used to store commands executed by the controller 110, or may be used to store user data. The memory 130 may further comprise various kinds of memories. The electronic device 100 may use a wireless interface 140 to receive data from a wireless communication network or to transmit data to the network, for example, through RF signals. The wireless interface 140 can include, for example, an antenna, wireless transceivers, and other necessary equipment for communicating wirelessly. Electronic devices 100 according to the present invention may be used as a communication interface protocol such as third generation communication systems, i.e., CDMA, GSM, NADC, E-TDMA, WCDMA, CDMA2000.

In exemplary embodiments, the programmable volume of a memory cell can comprise a chalcogenide material, for example, consisting of Te, Se, S, a combination thereof, or an alloy thereof. Alternatively, the chalcogenide material can consist of a material obtained by adding an impurity (e.g., Bi, Sr, Si, C, N, O, etc.) to Te, Se, S, a combination thereof, or an alloy thereof. Alternatively, the chalcogenide material can consist of a material selected from a group of Ge, Sb, Sn, As, Si, Pb, Te, Se, S, a combination thereof, and an alloy thereof. Alternatively, the chalcogenide material may consist of a material obtained by adding an impurity (e.g., Bi, Sr, Si, C, N, O, etc.) to one selected from a group of Ge, Sb, Sn, As, Si, Pb, Te, Se, S, a combination thereof, and an alloy thereof.

While the invention has been particularly shown and described with references to preferred embodiments thereof, it will be understood by those skilled in the art that various changes in form and details may be made herein without departing from the spirit and scope of the invention as defined by the appended claims.

For example, while the above-described embodiments depict multiple level cells that are operable in two or four states per cell, other numbers of states are conceivable, and equally applicable, to the principles of the present disclosure. For example, a cell can have multiple-level states of a number that is a multiple of two, such as 4, 8, 16, 32, etc. states Also, a cell can have other numbers of states that are not multiples of two, such as 3, 5, 6, 7, etc. states.

What is claimed is:

1. A memory device, comprising:
   a plurality of memory cells, each memory cell comprising a resistance-changeable material that has an initial resistance that is determined in response to an applied programming current in a programming operation; and
   a modification circuit that modifies the resistance of the memory cell following a programming operation of the memory cell to vary the resistance of the memory cell from the initial resistance to a second resistance by applying a saturation current in a saturation operation,
   each memory cell being connected to a conduction line of the memory device that is used to apply the programming current to program the resistance of the corresponding memory cell in the programming operation, that is used to apply the saturation current to the corresponding memory cell in the saturation operation and that is used to apply a read current to read the resistance of the corresponding memory cell in a subsequent read operation.

2. The memory device of claim 1 wherein the resistance changeable material comprises chalcogenide-based material.

3. The memory device of claim 1 wherein the saturation operation stabilizes the second resistance of the memory cell to minimize resistance drift of the memory cell until a read operation following the programming operation is performed.

4. The memory device of claim 1 wherein each memory cell further comprises a heating element in thermal communication with the corresponding memory cell material of the memory cell, the heating element receiving the programming current to heat the corresponding memory cell so that the memory cell material has the initial resistance and receiving the saturation current to heat the corresponding memory cell so that the memory cell material has the second resistance.

5. The memory device of claim 4 wherein the heating element comprises an electrode in contact with the corresponding memory cell material, the heating element comprising a resistive material that generates heat when current flows through the heating element.

6. The memory device of claim 1 wherein each memory cell can be programmed by the programming operation to occupy one of a plurality of states, each state including a range of resistances that are independent of neighboring resistance ranges of neighboring states, wherein a memory cell occupies an initial state following the programming operation and wherein the modification circuit stabilizes the resistance of the memory cell to a resistance within a range of resistances that corresponds to a final state following modification by the modification circuit.

7. The memory device of claim 6 wherein the memory cell is programmed by the programming operation to occupy more than two states.

8. The memory device of claim 7 wherein:
a low state of the plurality of states corresponds to a state having a lowest range of resistances, a high state of the plurality of states corresponds to a state having a highest range of resistances, and at least one intermediate state of the plurality of states corresponds to at least one state having a range of resistances greater than the lowest range of resistances of the low state and less than the highest range of resistances of the high state.

9. The memory device of claim 8 wherein the modification circuit applies the saturation current when the memory cell is being programmed by the programming operation to the intermediate state and the modification circuit does not apply the saturation current when the memory cell is being programmed by the programming operation to the low state or the high state.

10. The memory device of claim 1 wherein the second resistance is greater than the initial resistance as a result of the saturation operation.

11. The memory device of claim 1 wherein the conduction line comprises a bit line and wherein the modification circuit modifies the resistance of the memory cell by applying the saturation current in the form of a pulse of energy to a bit line of the memory cell during the saturation operation, following the programming operation.

12. The memory device of claim 11 wherein the pulse of energy has an amplitude that is less than the amplitude of the programming current.

13. The memory device of claim 11 wherein the pulse of energy is applied by a write driver circuit coupled to the memory cell via a bit line under control of the modification circuit.

14. The memory device of claim 1 wherein the plurality of memory cells comprises a plurality of addressable memory cells, and further comprising:
a decoder that receives an address from an external source, and that generates a row signal and a column signal for accessing at least one of the addressable memory cells during the programming and read operations.

15. A memory system comprising:
a memory controller that generates command and address signals; and
a memory module comprising a plurality of memory devices, the memory module receiving the command and address signals and in response storing and retrieving data to and from at least one of the memory devices,
wherein each memory device comprises:
a plurality of addressable memory cells;
a decoder that receives an address from an external source, and that generates a row signal and a column signal for accessing at least one of the addressable memory cells during programming and read operations;
each memory cell comprising a resistance-changeable material that has an initial resistance that is determined in response to an applied programming current in a programming operation; and
a modification circuit that modifies the resistance of the memory cell following a programming operation of the memory cell to vary the resistance of the memory cell from the initial resistance to a second resistance by applying a saturation current in a saturation operation,
each memory cell being connected to a conduction line of the memory device that is used to apply the programming current to program the resistance of the corresponding memory cell in the programming operation, that is used to apply the saturation current to the corresponding memory cell in the saturation operation and that is used to apply a read current to read the resistance of the corresponding memory cell in a subsequent read operation.

16. An electronic device including a memory system, the memory system comprising:
a memory controller that is arranged to connect to a data bus at which data signals are transferred; and
a memory device connected to the memory controller that stores and retrieves the data signals, the memory device comprising:
a plurality of memory cells, each memory cell comprising a resistance-changeable material that has an initial resistance that is determined in response to an applied programming current in a programming operation; and
a modification circuit that modifies the resistance of the memory cell following a programming operation of the memory cell to vary the resistance of the memory cell from the initial resistance to a second resistance by applying a saturation current in a saturation operation,
each memory cell being connected to a conduction line of the memory device that is used to apply the programming current to program the resistance of the corresponding memory cell in the programming operation, that is used to apply the saturation current to the corresponding memory cell in the saturation operation and that is used to apply a read current to read the resistance of the corresponding memory cell in a subsequent read operation.

17. A method of programming a memory device, the memory device comprising a plurality of memory cells, each memory cell comprising a resistance changeable material that has an initial resistance that is determined in response to an applied programming current in a programming operation, comprising:

performing a programming operation of the memory cell by applying a programming current to cause the memory cell to have an initial resistance;

modifying the resistance of the memory cell following the programming operation to vary the resistance of the memory cell from the initial resistance to a second resistance by applying a saturation current in a saturation operation.

18. The method of claim 17 wherein the resistance changeable material comprises a chalcogenide-based material.

19. The method of claim 17 wherein the saturation operation stabilizes the second resistance of the memory cell to minimize resistance drift of the memory cell until a read operation following the programming operation is performed.

20. The method of claim 17 wherein each memory cell further comprises a heating element in thermal communication with the corresponding memory cell material of the memory cell, wherein the programming operation is performed by applying the programming current to the heating element to heat the corresponding memory cell, and the resistance of the memory cell is modified by applying the saturation current to the heating element to heat the corresponding memory cell.

21. The method of claim 17 wherein each memory cell can be programmed by the programming operation to occupy one of a plurality of states, each state including a range of resistances that are independent of neighboring resistance ranges of neighboring states.

22. The method of claim 21 wherein the memory cell is programmed by the programming operation to occupy more than two states.

23. The method of claim 22 wherein:

a low state of the plurality of states corresponds to a state having a lowest range of resistances, a high state of the plurality of states corresponds to a state having a highest range of resistances, and at least one intermediate state of the plurality of states corresponds to at least one state having a range of resistances greater than the lowest range of resistances of the low state and less than the highest range of resistances of the high state.

24. The method of claim 23 wherein the saturation current is applied when the memory cell is being programmed by the programming operation to the intermediate state and the saturation current is not applied when the memory cell is being programmed by the programming operation to the low state or the high state.

25. The method of claim 17 wherein the second resistance is greater than the initial resistance as a result of the saturation operation.

26. The method of claim 17 wherein an amplitude of the saturation current is lower than that of the programming current preceding the saturation current.

* * * * *